United States Patent [19]

Ishikawa et al.

[11] Patent Number: 5,138,404
[45] Date of Patent: Aug. 11, 1992

[54] SEMICONDUCTOR DEVICE FOR PASSING CURRENT BETWEEN A GAAS LAYER AND AN INGAALP LAYER

[75] Inventors: Masayuki Ishikawa; Kazuhiko Itaya; Genichi Hatakoshi, all of Tokyo, Japan

[73] Assignee: Kabushiki Kaisha Toshiba, Kanagawa, Japan

[21] Appl. No.: 708,806

[22] Filed: May 31, 1991

Related U.S. Application Data

[63] Continuation of Ser. No. 327,497, Mar. 23, 1989, abandoned.

[30] Foreign Application Priority Data

Mar. 25, 1988 [JP] Japan .................................. 63-69640

[51] Int. Cl.$^5$ .................. H01L 29/161; H01L 29/205; H01L 29/225; H01L 33/00
[52] U.S. Cl. ........................................ 357/16; 357/17; 357/30; 357/45
[58] Field of Search ................. 357/16, 17, 30; 372/45, 372/46, 30

[56] References Cited

U.S. PATENT DOCUMENTS

| 4,617,724 | 10/1986 | Yokoyama | 29/576 |
| 4,661,961 | 4/1987 | Nelson et al. | 372/46 |
| 4,680,602 | 7/1987 | Watanabe et al. | 357/17 |
| 4,792,958 | 12/1988 | Ohba et al. | 357/17 |
| 4,809,287 | 2/1989 | Ohba et al. | 372/45 |
| 4,837,775 | 6/1989 | Andrews et al. | 372/96 |

FOREIGN PATENT DOCUMENTS

| 62-16952 | 1/1987 | Japan | 357/16 |
| 62-200784 | 9/1987 | Japan | 357/16 |
| 62-141772 | 12/1987 | Japan | 357/16 |

Primary Examiner—Andrew J. James
Assistant Examiner—Stephen D. Meier
Attorney, Agent, or Firm—Finnegan, Henderson, Farabow, Garrett and Dunner

[57] ABSTRACT

A semiconductor device for passing electric current between a GaAs semiconductor layer (103) and an InGaAlP semiconductor layer (101) both having the same conductivity type. The device includes a higher carrier density region (102) with the carrier density equal to or more than $5 \times 10^{17}$ cm$^{-3}$ and thickness in a rannge from 400 Å to 800 Å in at least a part of the InGaAlP layer (101) adjoining the GaAs layer (103). As a result, good ohmic contact is achieved and the semiconductor device has a lower operating voltage and a satisfactory thermal characteristic.

4 Claims, 3 Drawing Sheets

SEMICONDUCTOR DEVICE FOR PASSING CURRENT BETWEEN A GAAS LAYER AND AN INGAALP LAYER

This application is a continuation of application Ser. No. 07/327,497, filed Mar. 23, 1989, now abandoned.

BACKGROUND OF THE INVENTION

The present invention relates to a semiconductor device and, more particularly, to a semiconductor device in which an electric current is passed between a GaAs semiconductor layer and an InGaAlP semiconductor layer both having the same conductivity type.

InGaAlP materials now receive widespread attention as materials for light emitting devices in the short wavelength range, these materials having the largest energy gap among alloys of group III–V compound semiconductors, except for nitrides. In particular, those compositions capable of lattice matching with GaAs can offer satisfactory epitaxial growth, with fewer crystal defects, by the metal organic chemical vapor deposition method (hereinafter abbreviated as MOCVD method).

When manufacturing light emitting devices and electronic devices which contain InGaAlP materials as active parts, it is a frequent practice to bring such materials into contact with metals through GaAs, which is capable of lattice matching therewith for obtaining good ohmic contact (as described in "Applied Physics Letters," 48 (1986) p. 207, for example). However, the difference in energy gap between GaAs and InGaAlP materials is so large that discontinuous energy bands at the interface cause large notches or spikes that obstruct ohmic injection of electric current. In particular, a significant effect is more likely to be observed in p-type heterojunctions in which holes of low mobility serve as carriers.

One method for avoiding such an adverse effect is to dispose, between the GaAs layer and the InGaAlP layer, an InGaAlP layer having a lower Al composition ratio and an intermediate energy gap between those two layers, for the purpose of effecting the ohmic injection of electric current (as disclosed in Japanese Patent Laid-Open No. 62-200784 (1987), for example). However, the provision of such an InGaAlP intermediate energy gap layer does not necessarily offer an ohmic characteristic. As a result, the voltage drop at the interface can give rise to the problem of increasing the operating voltage of the device. When applied to semiconductor lasers, the resulting overheating creates high temperatures that impair the oscillation characteristics.

Thus, in an attempt to achieve ohmic contact through GaAs in a semiconductor device having its active part made of InGaAlP, good ohmic contact between InGaAlP and GaAs is not achieved and, hence, the device operating voltage increases and its thermal characteristic is degraded.

SUMMARY OF THE INVENTION

It is therefore an object of the present invention to provide conditions necessary for good ohmic contact between semiconductor layers.

This and other objects are accomplished by a semiconductor device that achieves good ohmic contact between semiconductor layers, a low operating voltage and a satisfactory thermal characteristic. An electric current is caused to pass between an InGaAlP layer and a GaAs layer of the semiconductor device, both layers being of the same conductivity type, by providing in at least a part of the InGaAlP layer adjoining the GaAs layer, a higher carrier density region with the carrier density equal to or more than $5 \times 10^{17}$ cm$^{-3}$ and a thickness in a range of 400 Å to 800 Å.

Thus, according to the present invention, in a semiconductor device in which electric current is caused to pass between an InGaAlP layer and a GaAs layer both being of the same conductivity type, it becomes possible to achieve good ohmic contact and, as a result, provide a semiconductor device which has a low operating voltage and a satisfactory thermal characteristic.

BRIEF DESCRIPTION OF THE DRAWINGS

In the detailed description of preferred embodiments of the invention presented below, reference is made to the accompanying drawings in which.

DETAILED DESCRIPTION OF THE PREFERRED EMBODIMENT

Details of the present invention will be described below in connection with the illustrated embodiments.

Figure 1:
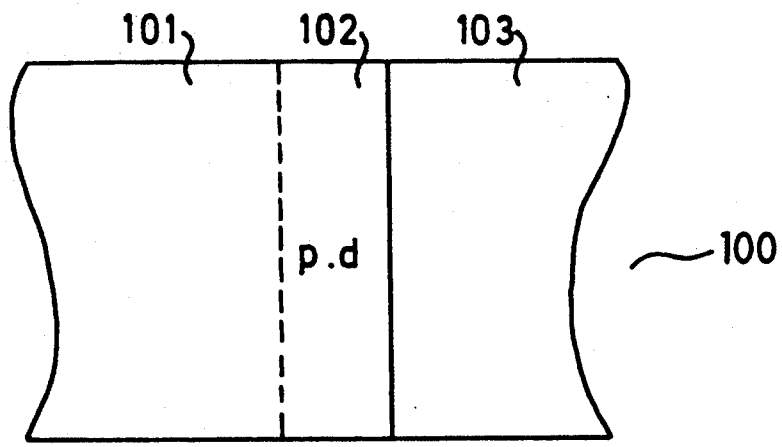
FIG. 1 is a conceptual view of a semiconductor device in accordance with one preferred embodiment of the invention.
Figure 1:
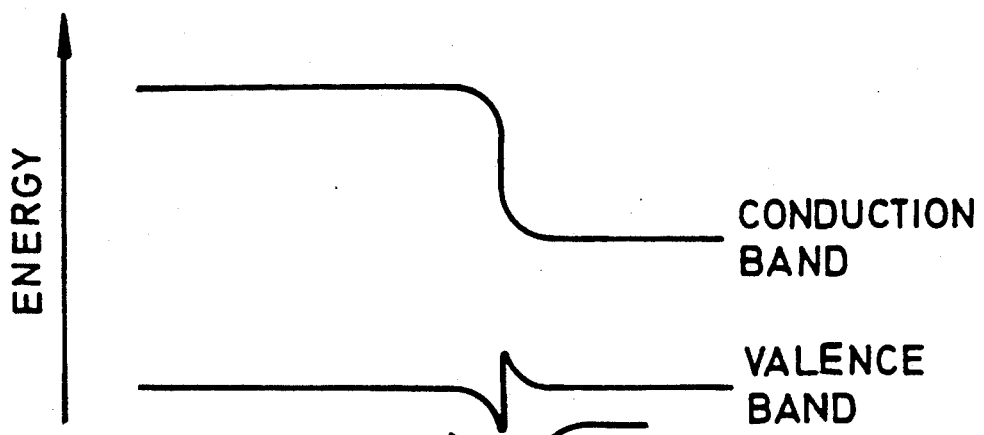

FIG. 1 is a conceptual view showing a first embodiment of the present invention. A semiconductor device 100 has an In$_{1-x-y}$Ga$_y$Al$_x$P ($0 \leq x,y \leq 1$)layer 101, a higher carrier density region 102 in the In$_{1-x-y}$Ga$_y$Al$_x$P layer 101, and a GaAs layer 103. The layers are of the same conductivity type and are illustrated as being p-type. It is important, particularly in light emitting devices or the like, that In$_{1-x-y}$Ga$_y$Al$_x$P layer 101 is capable of lattice matching with GaAs layer 103, to assure the epitaxial layer grown on the GaAs layer of possibly perfect crystallinity. One example of composition ratios x,y meeting the above conditions is given by:

$$x+y=0.5$$

Figure 2:
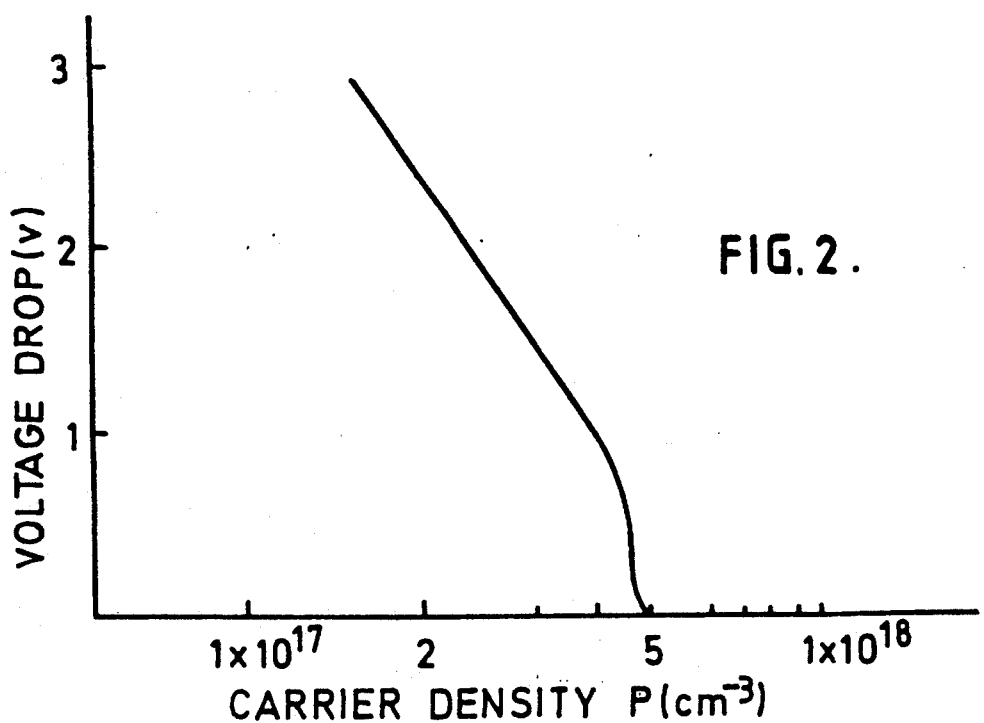
FIG. 2 is a graph showing a characteristic curve of voltage drop across the interface between a GaAs layer and a higher carrier density region shown in FIG. 1 vs. a carrier density p of the higher carrier density region.

It has been found by experiment that whether a satisfactory current-voltage characteristic can be obtained between the GaAs layer 103 and the In$_{1-x-y}$Ga$_y$Al$_x$P layer 101, is largely dependent on a carrier density p and a thickness d of the higher carrier density region 102. FIG. 2 shows the magnitude of voltage drop across the interface between GaAs layer 103 and the higher carrier density region 102 with respect to the carrier density p, with an injection current density of 1 ka/cm$^2$ applied to the device. With the carrier density of $p \geq 5 \times 10^{17}$ cm$^{-3}$, there is no voltage drop effect, and hence no problems of increased operating voltage and generated heat. However, if the carrier density is increased to enter a range of $p > 3 \times 10^{19}$ cm$^{-3}$, the number of defects formed in the higher carrier density region is drastically increased. A continuous performance test at 50° C. and 3 mW showed that a device with such a higher carrier density undergoes degradation failure after approximately 100 hours. This is quite inferior in reliability to the value of 1000 hours or more that is obtained with a carrier density of $p \leq 3 \times 10^{19}$ cm$^{-3}$. The effect of the voltage drop resulting from a carrier density of $p < 5 \times 10^{17}$ cm$^{-3}$ (FIG. 2) is so great as to bring forth an excessive increase in operating voltage and overheating.

Figure 3:
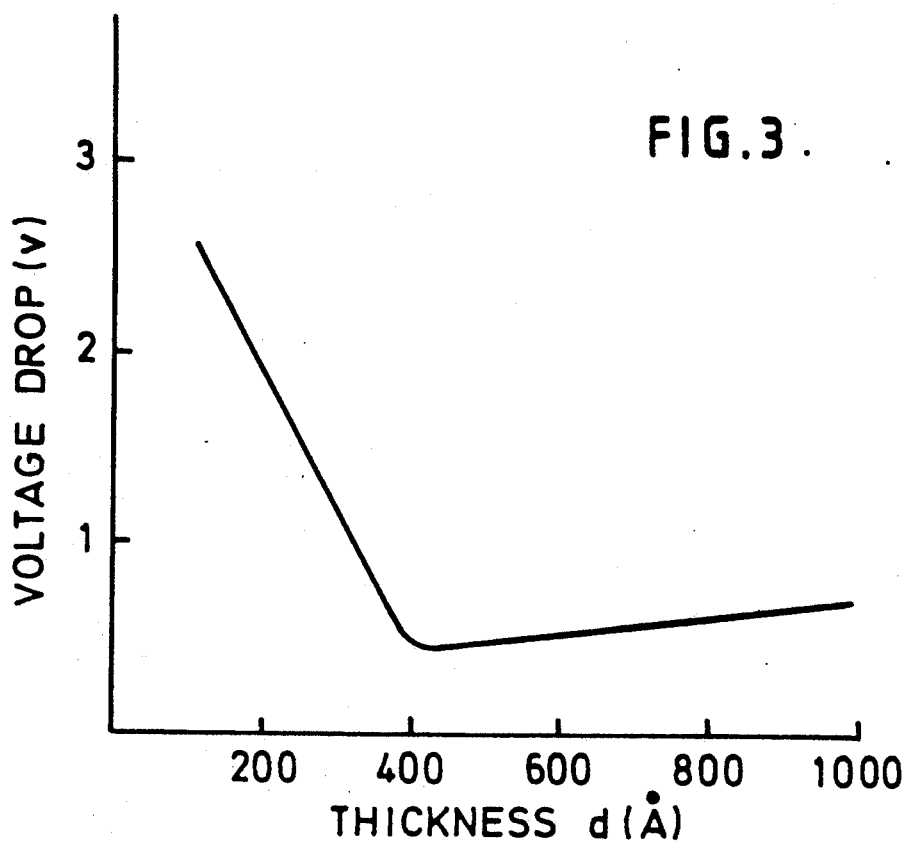
FIG. 3 is a graph showing a characteristic curve of voltage drop between the GaAs layer and an InGaAlP layer vs. thickness d of the higher carrier density region shown in FIG. 1.

It has also been found that a similar voltage drop effect is experienced when the thickness d of higher carrier density region 102 is very thin. FIG. 3 shows the voltage drop between GaAs layer 102 and InGaAlP layer 101 with respect to the thickness d of higher carrier density region 102, with an injection current density of 1 kA/cm$^2$ applied to the device and the carrier density of the higher carrier density region equal to $1 \times 10^{18}$ cm$^{-3}$. In a range of $d < 400$ Å, the voltage increases drastically. In a range of $d \geq 400$ Å, the voltage drop gradually increases due to an increase in the series resistance with the increasing layer thickness.

As described above, the current-voltage characteristic between GaAs layer 103 and InGaAlP layer 101 is largely affected by the carrier density p and the thickness d of higher carrier density region 102 formed in InGaAlP layer 101 adjacent the interface with GaAs layer 103, the carrier density p and the thickness d being required to fall in ranges of $p \geq 5 \times 10^{17}$ cm$^{-3}$ and $d \geq 400$ Å, respectively. As to the carrier density p, since the range of $p > 3 \times 10^{19}$ cm$^{-3}$ will cause the above-described problem, p is preferably maintained within a range of $5 \times 10^{17}$ cm$^{-3} \leq p \leq 3 \times 10^{19}$ cm$^{-3}$.

Figure 4:
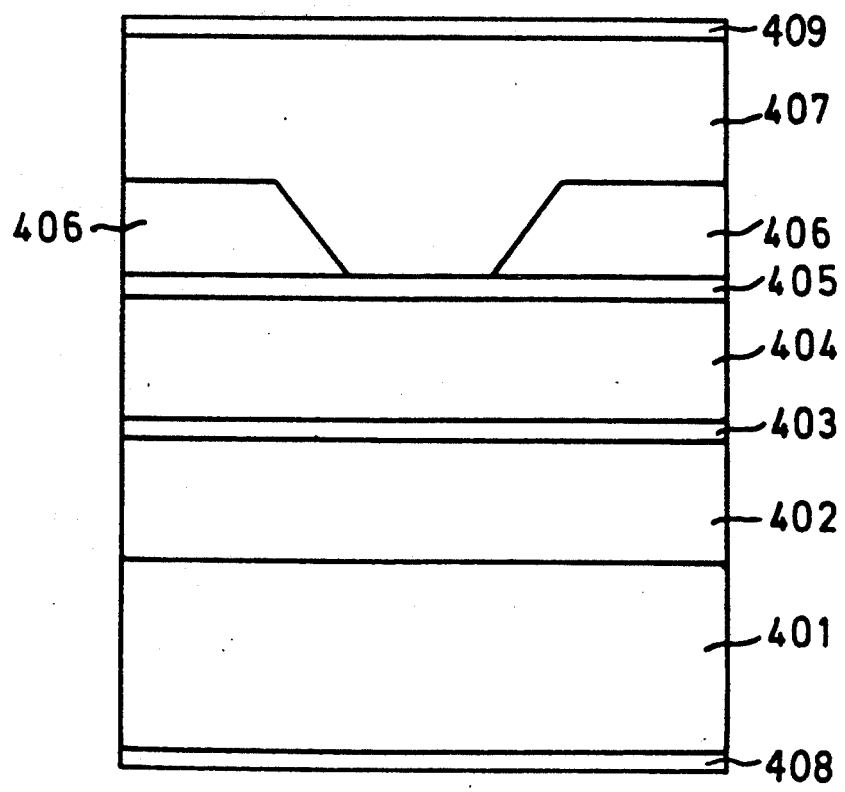
FIG. 4 and FIG. 6 are cross-sectional views of semiconductor light emitting devices in accordance with preferred embodiments of the invention.

FIG. 4 shows a semiconductor light emitting device according to a second embodiment of the present invention, and is a sectional view showing the schematic structure of a semiconductor laser in which a GaAs layer and an InGaAlP layer serve as an ohmic contact layer and a clad layer, respectively. Referring to FIG. 4, the device comprises an n-GaAs substrate 401. Over substrate 401, there is formed a double heterojunction comprising a n-In$_{1-w-z}$Ga$_z$Al$_w$P ($0 \leq w, z \leq 1$) clad layer 402, an In$_{1-s-t}$Ga$_t$Al$_s$P ($0 \leq s, t \leq 1$) active layer 403, and a p-In$_{1-u-v}$Ga$_v$Al$_u$P ($0 \leq u, v \leq 1$) clad layer 404, the junction serving as a light emitting active part. Over the p-InGaAlP clad layer 404, there are formed a p-InGaP (In$_{1-x-y}$Ga$_y$Al$_x$P; $0 \leq x, y \leq 1$) cap layer 405 and n-GaAs current restricting layers 406, in the order described. It is preferred that cap layer 405 contain no aluminum, i.e., x=0. Therefore, cap layer 405 of the aperture portion between current restricting layers 406 is not oxidized even if cap layer 405 is exposed to the atmosphere. However, small amounts of aluminum may be present without adversely affecting the performance of the layer. A strip of n-GaAs current restricting layer 406 is selectively removed. A p-GaAs ohmic contact layer 407 is formed over the portion of p-InGaP cap layer 405 where the overlying n-GaAs current restricting layer 406 has been removed, and also over the remaining portions of n-GaAs current restricting layer 406. Furthermore, an electrode 408 is formed on the bottom of substrate 401 and an electrode 409 is formed on the top of p-GaAs layer 407. Composition ratios of In, Ga and Al are set so that the respective layers constituting the double heterojunction and p-InGaP cap layer 405 have their lattice constants substantially equal to that of the substrate, and clad layers 402, 404 have their band gap energies larger than that of active layer 403.

The strip of n-GaAs current restricting layer 406 selectively removed has a width of 7 μm and a cavity length of 300 μm. In the case of providing p-InGaP cap layer 405 with a carrier density of $1 \times 10^{18}$ cm$^{-3}$ and a thickness of 500 Å, the semiconductor laser exhibited an oscillation threshold current of 70 mA in the pulse operation mode and 72 mA in the continuous operation mode. Thus, it has been proved that the change in oscillation threshold current caused by generated heat is very small as compared with the value in the pulse operation mode. There has also been achieved a maximum continuous oscillation temperature of 90° C. This is attributable to the fact that no excessive voltage drop occurs across the heterojunction interfaces of p-GaAs/p-InGaP/p-InGaAlP, and hence the operating voltage at the oscillation threshold is held as low as 2.3 volts. Achievement of continuous oscillation at 90° C. is a substantial improvement over the above described prior art devices.

In the case of providing p-InGaP cap layer 405 with a carrier density equal to $4 \times 10^{17}$ cm$^{-3}$, the operating voltage exhibited a very large value of 3.0 volt. Correspondingly, the generated heat in the continuous operation mode was increased and the oscillation threshold current reached as high as 77 mA. Also, the maximum continuous oscillation temperature was as low as 60° C. This may likely be attributable to the fact that the excessive voltage drop occurs across the heterojunction interfaces of p-GaAs/p-InGaP/p-InGaAlP.

Further, in the case of setting the cap layer 405 thickness equal to 250 Å, even with the carrier density of p-InGaP cap layer 405 set equal to $1 \times 10^{18}$ cm$^{-3}$, the operating voltage exhibited a very large value of 3.0 volt. Correspondingly, the generated heat in the continuous operation mode increased and the oscillation threshold current reached as high as 77 mA. Further, the maximum continuous oscillation temperature was as low as 60° C. In the case of increasing the p-InGaP cap layer thickness to the order of 1000 Å, instead of the above thickness, the maximum continuous oscillation temperature experienced was as low as 30° C. due to increases in both the thermal resistance and threshold current resulting from the current being more widely spread, as well as an increase in the generated heat resulting from the increased series resistance.

Figure 5:
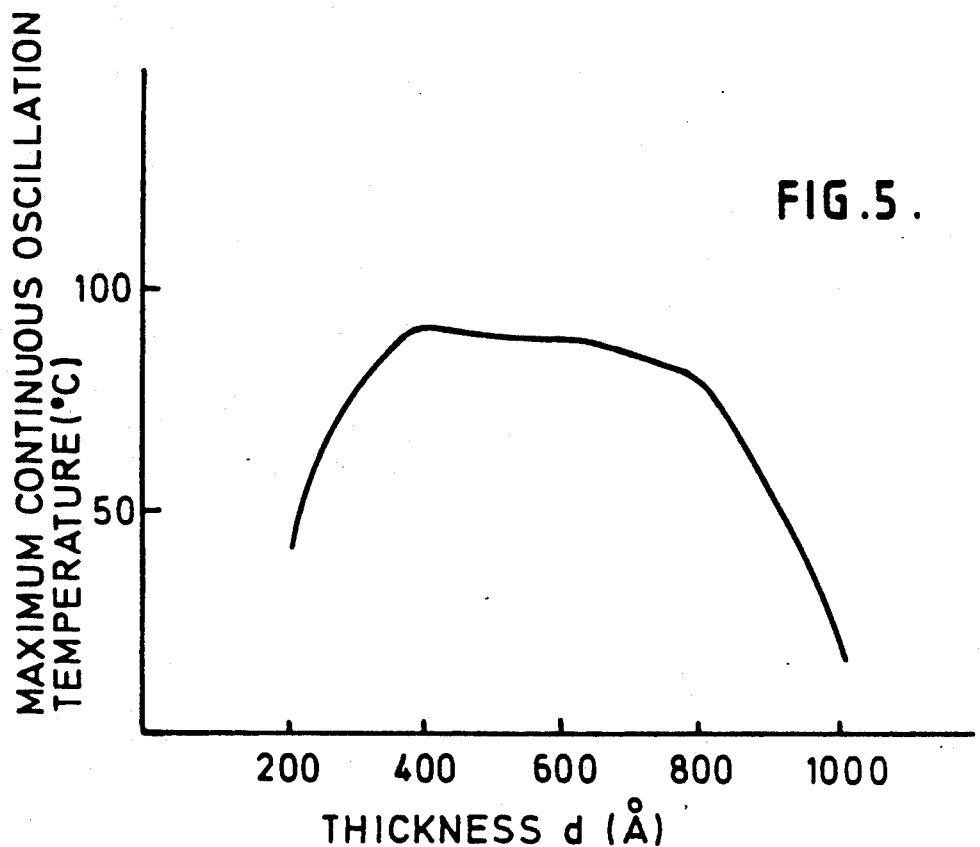
FIG. 5 is a graph showing a characteristic curve of a maximum continuous oscillation temperature vs. thickness d of the higher carrier density region of the semiconductor light emitting device shown in FIG. 4.

FIG. 5 shows the dependence of the maximum continuous oscillation temperature on a thickness d of p-InGap cap layer 405. With the thickness falling in a range of $400 \text{ Å} \leq d \leq 800 \text{ Å}$, the maximum continuous oscillation temperature exhibited a high value of more than 80° C., the temperatures experienced outside that thickness range being substantially lower. Particularly, in a range of $400 \text{ Å} \leq d \leq 600 \text{ Å}$, the maximum continuous oscillation temperature became more than 85° C., so that a very satisfactory thermal characteristic was observed. The achievement of continuous oscillation at these temperatures is a substantial improvement over prior art devices.

Figure 6:
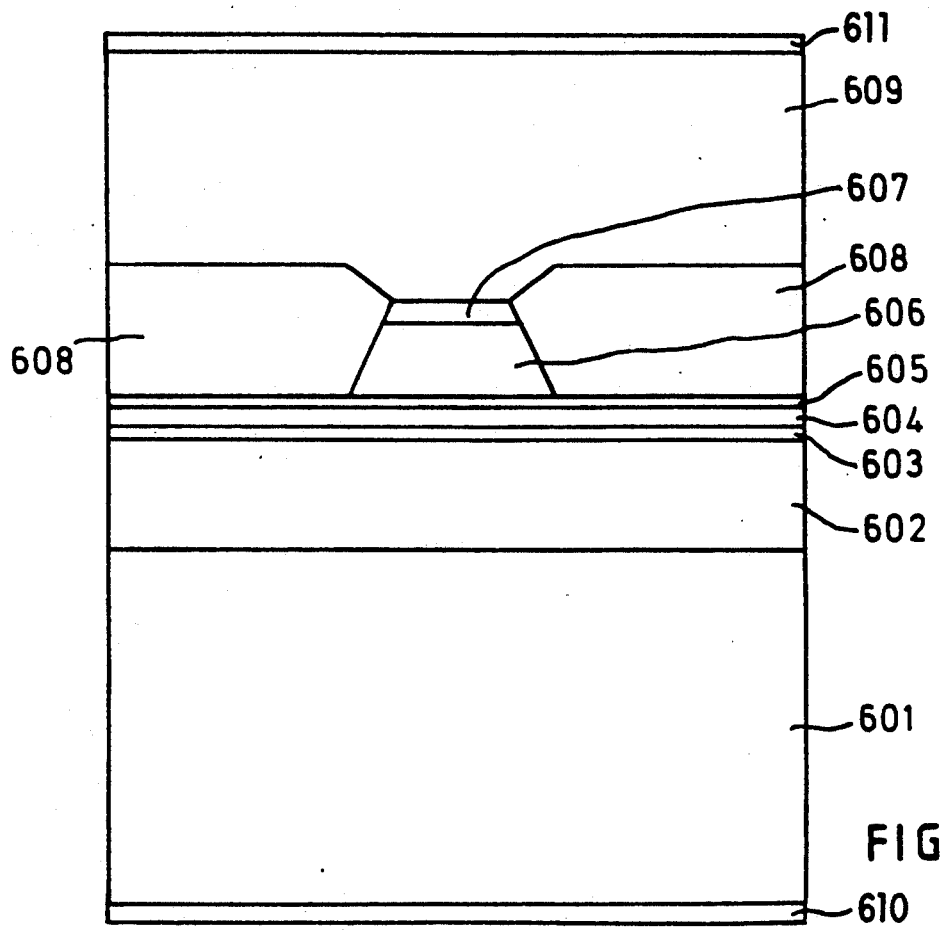

FIG. 6 shows a semiconductor light emitting device according to a third embodiment of the present invention, and is a sectional view showing the schematic structure of a semiconductor laser in which a GaAs layer and an InGaAlP layer serve as an ohmic contact layer and clad layer, respectively. Referring to FIG. 6, the device comprises an n-GaAs substrate 601. Over substrate 601, there is formed a double heterojunction comprising an n-$In_{1-w-z}Ga_zAl_wP$ ($0 \leq w,z \leq 1$) clad layer 602, an $In_{1-s-t}Ga_tAl_sP$ ($0 \leq s,t \leq 1$) active layer 603, a p-$In_{1-r-s}Ga_sAl_rP$ ($0 \leq r,s \leq 1$) first clad layer 604, a p-$In_{1-p-q}Ga_qAl_pP$ ($0 \leq p,q \leq 1$) etching stopper layer 605 and a p-$In_{1-u-v}Ga_vAl_uP$ ($0 \leq u,v \leq 1$) second clad layer 606 being in strip form and convex in section, the junction serving as a light emitting active part. Over the convex portions of p-In-GaAlP second clad layer 606, there is formed a p-InGaP ($In_{1-x-y}Ga_yAl_xP$; $0 \leq x,y \leq 1$) cap layer 607. It is preferred that cap layer 607 contain no aluminum, i.e., x=0. However, small amounts of aluminum may be present without adversely affecting the performance of the layer. In areas except for the convex portions of p-InGaAlP clad layer 606, there are formed n-GaAs current restricting layers 608. A p-GaAs ohmic contact layer 609 is formed over p-InGaP cap layer 607 and n-GaAs current restricting layers 608. Furthermore, an electrode 610 is formed on the bottom of substrate 601, and an electrode 611 is formed on the top of p-GaAs layer 609. Composition ratios of In, Ga and Al are set so that the respective layers constituting the double heterojunction and the p-InGaP cap layer 607 have their lattice constants substantially equal to that of the substrate, and the clad layers 602, 604, 606 respectively have band gap energies larger than that of active layer 603.

The strip width and the cavity length were selected to be 5 μm and 300 μm, respectively. The maximum continuous oscillation temperature of the semiconductor laser illustrated in FIG. 6 is dependent on both the carrier density and the thickness of p-InGap cap layer 607. This dependency was found to be substantially identical to that of the device having the structure of the second embodiment shown in FIG. 4. With respect to the device having the structure of the third embodiment, when forming p-InGaAlP clad layer 606 in strip form and convexed, it is necessary to selectively remove p-InGaP cap layer 607 except for areas corresponding to the convex portions of layer 606. When a mixed solution of $Br_2$, HBr and $H_2O$ is employed for etching p-InGaP cap layer 607, the etching rates of p-InGaAlP clad layer 606 and p-InGaP cap layer 607 tend to be partially increased in the vicinity of the strip projecting portions. For this reason, in order to achieve flat and satisfactory etching, it is desirable to minimize the thickness of p-InGaP cap layer 607 and hence make as short as possible the etching time necessary for removing p-InGaP cap layer 607. The thickness of p-InGaP cap layer 607 allowing such flat and satisfactory etching was found to be less than 600 Å.

Although a semiconductor laser has been described as using p-InGaP as the cap layer material in the foregoing embodiments, the cap layer may generally be formed of InGaAlP as well. In such a case, the cap layer is selected to have an energy gap smaller than that of the clad layer, so that the difference in energy gap between the cap layer and the GaAs layer is reduced, thereby making it easier to obtain an ohmic characteristic. Needless to say, the present invention is also applicable to any semiconductor devices, such as light emitting diodes and other electronic elements, which have a contact interface between an InGaAlP layer and a GaAs layer both having the same conductivity type, and having a function of passing an electric current through that interface. In addition, the present invention can be practiced in other various modified forms without departing from the scope of the present invention.

As fully described above, according to the present invention, in a semiconductor device in which electric current is caused to pass between an InGaAlP layer and a GaAs layer both having the same conductivity type, it becomes possible to achieve good ohmic contact, and hence provide a semiconductor element which has low operating voltage and a satisfactory thermal characteristic.

It will be apparent to those of ordinary skill in the art that various modifications and variations can be made to the above-described embodiments without departing from the scope of the appended claims and their equivalents.

What is claimed is:

1. A semiconductor light emitting device comprising:
   (a) a double heterojunction structure having an n-type $In_{1-w-z}Ga_zAl_wP$ ($0 \leq w,z \leq 1$) clad layer, an $In_{1-s-t}Ga_tAl_sP$ ($0 \leq s,t \leq 1$) active layer and a p-type $In_{1-u-v}Ga_vAl_uP$ ($0 \leq u,v \leq 1$) clad layer;
   (b) a p-type GaAs ohmic contact layer over said p-type $In_{1-u-v}Ga_vAl_uP$ ($0 \leq u,v \leq 1$) clad layer; and
   (c) a high carrier density region formed of p-type $In_{1-x-y}Ga_yAl_xP$ layer ($0 \leq x,y \leq 1$) and having a carrier density equal to or more than $5 \times 10^{17}$ cm$^{-3}$ and a thickness in a range from 400 Å to 800 Å provided between said p-type $In_{1-u-v}Ga_vAl_uP$ ($0 \leq u,v \leq 1$) clad layer and said p-type GaAs ohmic contact layer, wherein said high carrier density region has a band gap energy equal to or less than said p-type clad layer.

2. A semiconductor light emitting device according to claim 1, in which said high carrier density region has a carrier density in a range from $5 \times 10^{17}$ cm$^{-3}$ to $3 \times 10^{19}$ cm$^{-3}$.

3. A semiconductor light emitting device, comprising:
   (a) a double heterojunction structure having an n-type $In_{1-w-z}Ga_zAl_wP$ ($0 \leq w,z \leq 1$) clad layer, an $In_{1-s-t}Ga_tAl_sP$ ($0 \leq s,t \leq 1$) active layer, a first p-type $In_{1-r-s}Ga_sAl_rP$ ($0 \leq r,s \leq 1$) clad layer, a p-type $In_{1-p-q}Ga_qAl_pP$ ($0 \leq p,q \leq 1$) etching stopper layer in contact with said first p-type clad layer and a second p-type $In_{1-u-v}Ga_vAl_uP$ ($0 \leq u,v \leq 1$) clad layer in strip form in contact with said p-type etching stopper layer.
   (b) a p-type GaAs ohmic contact layer over said second p-type $In_{1-u-v}Ga_vAl_uP$ ($0 \leq u,v \leq 1$) clad layer; and
   (c) a high carrier density region formed of a p-type $In_{1-x-y}Ga_yAl_xP$ layer ($0 \leq x,y \leq 1$) and having a carrier density equal to or more than $5 \times 10^{17}$ cm$^{-3}$ and a thickness in a range of 400 Å to 800 Å provided between said second p-type $In_{1-u-v}Ga_vAl_uP$ clad layer and said p-type GaAs ohmic contact layer, wherein said high carrier density layer has a band gap energy equal to or less than said second p-type clad layer.

4. A semiconductor light emitting device according to claim 3, in which said high carrier density region has a carrier density in a range from $5 \times 10^{17}$ cm$^{-3}$ to $3 \times 10^{19}$ cm$^{-3}$.

* * * * *